(12) United States Patent
LaBonte et al.

(10) Patent No.: US 11,112,694 B2
(45) Date of Patent: Sep. 7, 2021

(54) METHODS OF FORMING VARIABLE-DEPTH DEVICE STRUCTURES

(71) Applicant: Applied Materials, Inc., Santa Clara, CA (US)

(72) Inventors: Andre P. LaBonte, Mechanicville, NY (US); Ludovic Godet, Sunnyvale, CA (US); Rutger Meyer Timmerman Thijssen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/931,333

(22) Filed: May 13, 2020

(65) Prior Publication Data

US 2020/0363719 A1   Nov. 19, 2020

Related U.S. Application Data

(60) Provisional application No. 62/848,477, filed on May 15, 2019, provisional application No. 62/881,569, filed on Aug. 1, 2019.

(51) Int. Cl.

| | | |
|---|---|---|
| *G03F 7/00* | (2006.01) | |
| *G03F 7/20* | (2006.01) | |
| *H01L 21/3065* | (2006.01) | |
| *H01L 21/311* | (2006.01) | |
| *H01L 21/302* | (2006.01) | |
| *G02B 5/18* | (2006.01) | |
| *G02B 27/01* | (2006.01) | |

(52) U.S. Cl.
CPC ......... *G03F 7/0035* (2013.01); *G02B 5/1857* (2013.01); *G03F 7/0005* (2013.01); *G03F 7/2043* (2013.01); *H01L 21/302* (2013.01); *H01L 21/3065* (2013.01); *H01L 21/311* (2013.01); *H01L 21/31111* (2013.01); *G02B 27/0172* (2013.01); *G02B 2027/0174* (2013.01)

(58) Field of Classification Search
None
See application file for complete search history.

(56) References Cited

U.S. PATENT DOCUMENTS

| | | |
|---|---|---|
| 2007/0263973 A1 | 11/2007 | Van Laere et al. |
| 2016/0033784 A1 | 2/2016 | Levola et al. |
| 2016/0204294 A1 | 7/2016 | Kuznicki |
| 2017/0307887 A1 | 10/2017 | Stenberg et al. |
| 2020/0271850 A1* | 8/2020 | Vora ............... G02B 5/1871 |

FOREIGN PATENT DOCUMENTS

JP      2010102008 A     5/2010

OTHER PUBLICATIONS

International Search Report dated Aug. 21, 2020 for Application No. PCT/US2020/032694.

* cited by examiner

*Primary Examiner* — Jiong-Ping Lu
(74) *Attorney, Agent, or Firm* — Patterson + Sheridan, LLP

(57) ABSTRACT

A method for forming a device structure is disclosed. The method of forming the device structure includes forming a variable-depth structure in a device material layer using cyclic-etch process techniques. A plurality of device structures is formed in the variable-depth structure to define vertical or slanted device structures therein. The variable-depth structure and the vertical or slanted device structures are formed using an etch process.

27 Claims, 19 Drawing Sheets

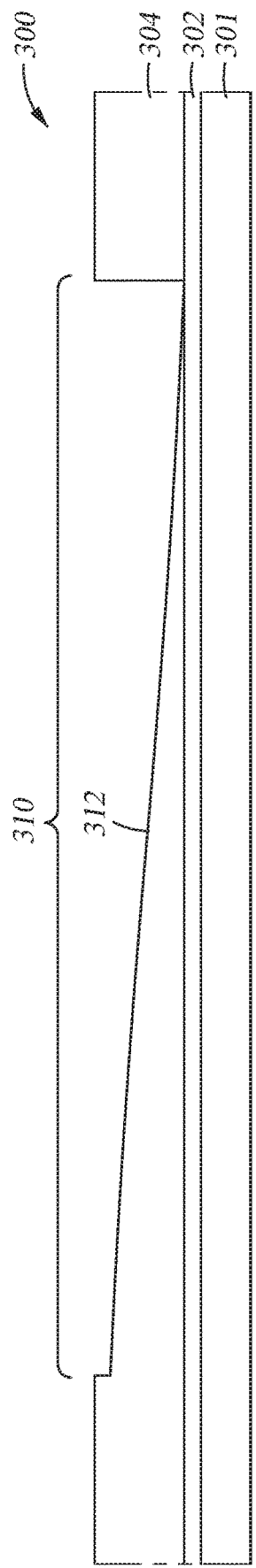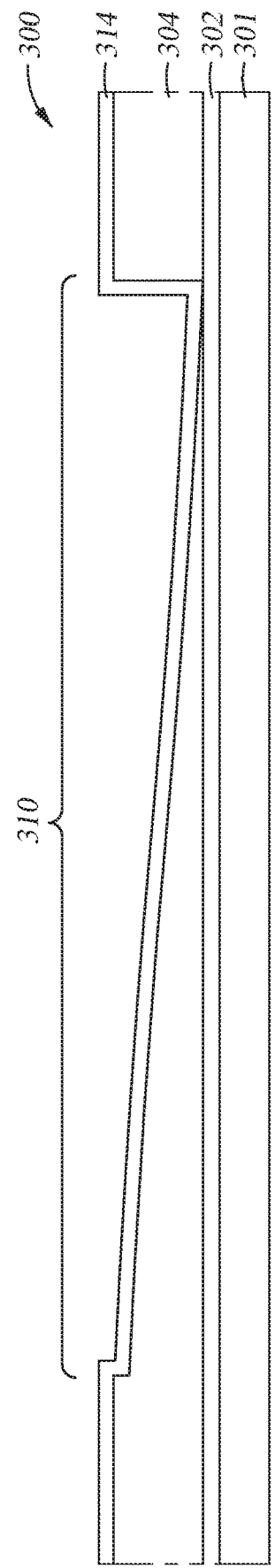
Fig. 3C
Fig. 3D

METHODS OF FORMING VARIABLE-DEPTH DEVICE STRUCTURES

CROSS-REFERENCE TO RELATED APPLICATIONS

This application claims benefit of U.S. Provisional Patent Application Ser. No. 62/848,477, filed May 15, 2019, and U.S. Provisional Patent Application Ser. No. 62/881,569, filed Aug. 1, 2019, which are herein incorporated by reference.

BACKGROUND

Field

Embodiments of the present disclosure generally relate to optical devices for augmented, virtual, and mixed reality. More specifically, embodiments described herein provide forming variable-depth device structures of optical devices.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device, or handheld device, to view the surrounding environment, yet also see images of virtual objects that are generated in the display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlayed on an ambient environment. Optical devices are used to assist in overlaying images. Generated light is propagated through a waveguide until the light exits the waveguide and is overlayed on the ambient environment. Fabricating optical devices can be challenging as optical devices tend to have non-uniform properties. Accordingly, improved methods of fabricating optical devices are needed in the art.

SUMMARY

The present disclosure generally relates to a method for forming a device structure for use in a display apparatus or in other applications. More specifically, the disclosure relates to a variable-depth structure for use in the device structure created using an etch process. The method herein may also form a device structure that is used as a master for nano-imprint lithography.

In one embodiment, a method of forming a device structure is provided. The method includes forming a gray-tone resist over a device material, the forming the gray-tone resist includes disposing a resist material over the device material, developing the resist material to form a gray-tone pattern and performing a cyclic-etch process. The cyclic-etch process includes etching a resist segment of the gray-tone pattern using a resist etch process selective to the resist material and etching a device segment of the device material using a device pattern etch process selective to the device material. The method also includes repeating the resist etch process for subsequent resist segments of the gray-tone pattern and etching subsequent device segments to form a device material pattern, the device material pattern having a gradient. The method further includes disposing a hardmask over the device material, patterning the hardmask to expose segments of the device material, and etching exposed segments of the device material to form a plurality of device structures having a variable depth corresponding to the gradient.

In one embodiment, a method of forming a device structure is provided. The method includes disposing a device material layer over a surface of a substrate, disposing a hardmask over the device material layer, patterning the hardmask to expose segments of the device material layer, and forming a gray-tone resist over the hardmask. The forming the gray-tone resist includes disposing a resist material over the hardmask and developing the resist material to form a gray-tone pattern. The method further includes performing a cyclic-etch process, the cyclic-etch process includes etching a resist segment of the gray-tone pattern using a resist etch process selective to the resist material and etching an exposed segment of the device material layer using a device etch process selective to a device material of the device material layer. The method further includes repeating the resist etch process for subsequent resist segments of the gray-tone pattern and repeating the device etch process for subsequent exposed device segments of the device material layer to form a plurality of device structures having a variable depth.

In one embodiment, a method of forming a device structure is provided. The method includes disposing a hardmask over a surface of a substrate and patterning the hardmask to expose segments of the substrate. The method further includes forming a gray-tone resist over the hardmask, the forming the gray-tone resist includes disposing a resist material over the hardmask, developing the resist material to form a gray-tone pattern, and performing a cyclic-etch process. The cyclic-etch process includes etching a resist segment of the gray-tone pattern using a resist etch process selective to the resist material and etching an exposed segment of the substrate using a device etch process selective to the substrate material. The method further includes repeating the resist etch process for subsequent resist segments of the gray-tone pattern and repeating the device etch process to exposed segments of the substrate material layer to form a plurality of device structures in the substrate having a variable depth.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A-3K are schematic, cross-sectional views of a portion of a variable-depth structure according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods of forming a device structure having variable-depth device structures. To accomplish this, a method includes forming a plurality of channels in the variable-depth structure to define device structures therein. The variable-depth structure is formed using an etch process and the device structures are formed using a selective etch process. The method described herein can also be used to create a device structure that functions as a master for nanoimprint lithography.

Figure 1:
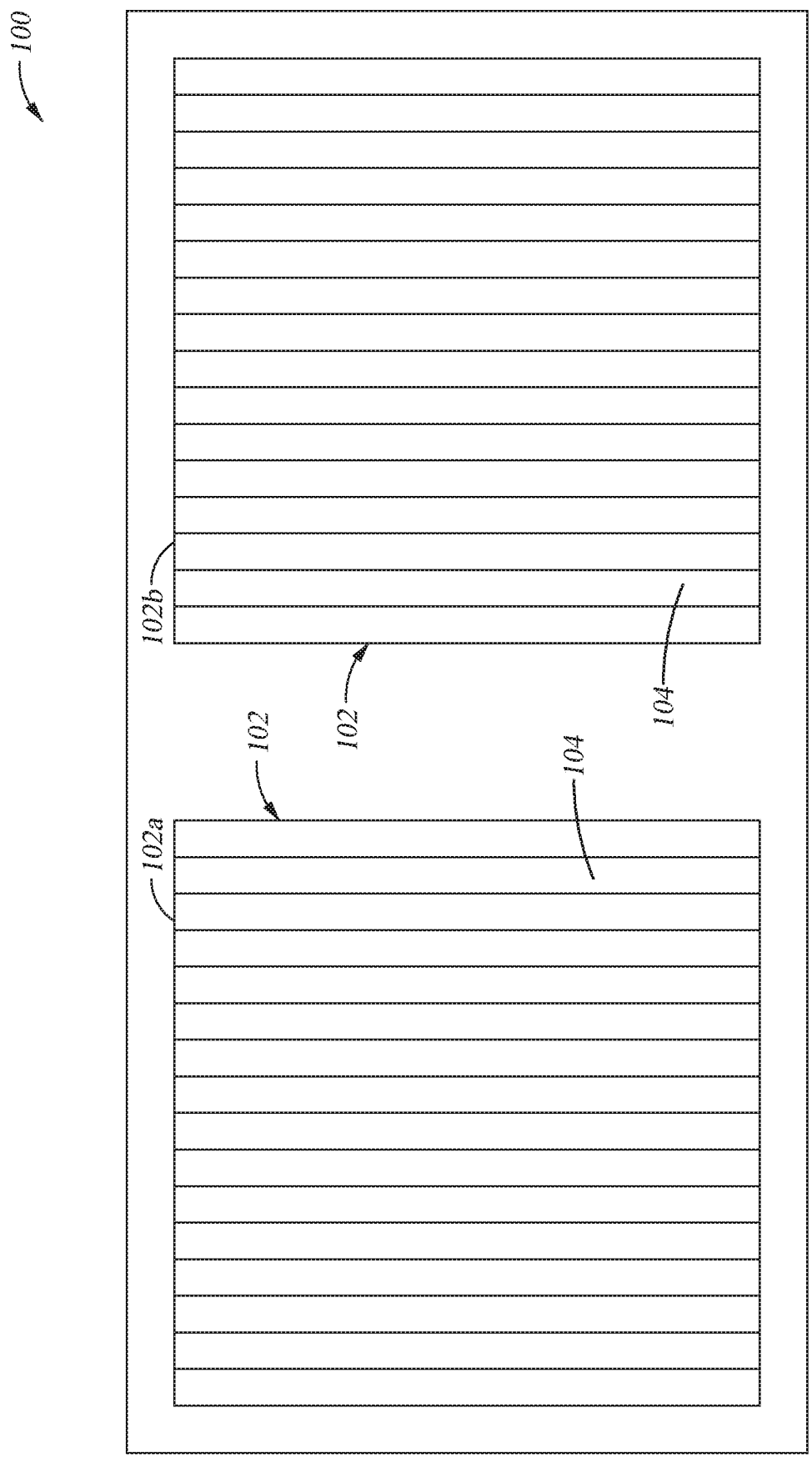
FIG. 1 is a front view of an optical device according to an embodiment.

FIG. 1 is a front view of an optical device 100. It is to be understood that the optical device 100 described below is an exemplary optical device. In one embodiment, the optical device 100 is a waveguide combiner, such as an augmented reality waveguide combiner. In another embodiment, the optical device 100 is a flat optical device, such as a metasurface. The optical device 100 includes a plurality of device structures 104. The device structures 104 may be nanostructures having sub-micron dimensions, e.g., nano-sized dimensions, such as critical dimensions less than 1 µm. In one embodiment, regions of the device structures 104 correspond to one or more gratings 102, such as the grating areas 102a and 102b. In one embodiment, the optical device 100 includes a first grating area 102a and a second grating area 102b and each of the first grating area 102a and second grating area 102b each contain a plurality of device structures 104.

The depth of the gratings 102 may vary across the grating areas 102a and 102b in embodiments described herein. In some embodiments, the depth of the gratings 102 may vary smoothly over the first grating area 102a and over the second grating area 102b. In one example embodiment, the depth may range from about 10 nm to about 400 nm across one of the grating areas. The grating area 102a, in an example embodiment, can range from approximately 20 mm to approximately 50 mm on a given side. Therefore, as one example, the angle of the change in the depth of the gratings 102 may be on the order of 0.0005 degrees.

In embodiments described herein, the device structures 104 may be created using selective etching techniques such as gray-tone etch and/or laser ablation techniques. Selective etching techniques, as used herein, are used to create three-dimensional microstructures in the device material and substrate material, or optionally to create a variable-depth structure in a sacrificial layer overlaying the device material as part of a variable-depth structure process. Using selective etching techniques to create the optical device structures 104 allows for fewer processing operations and higher variable-depth resolution than existing methods.

Figure 2:
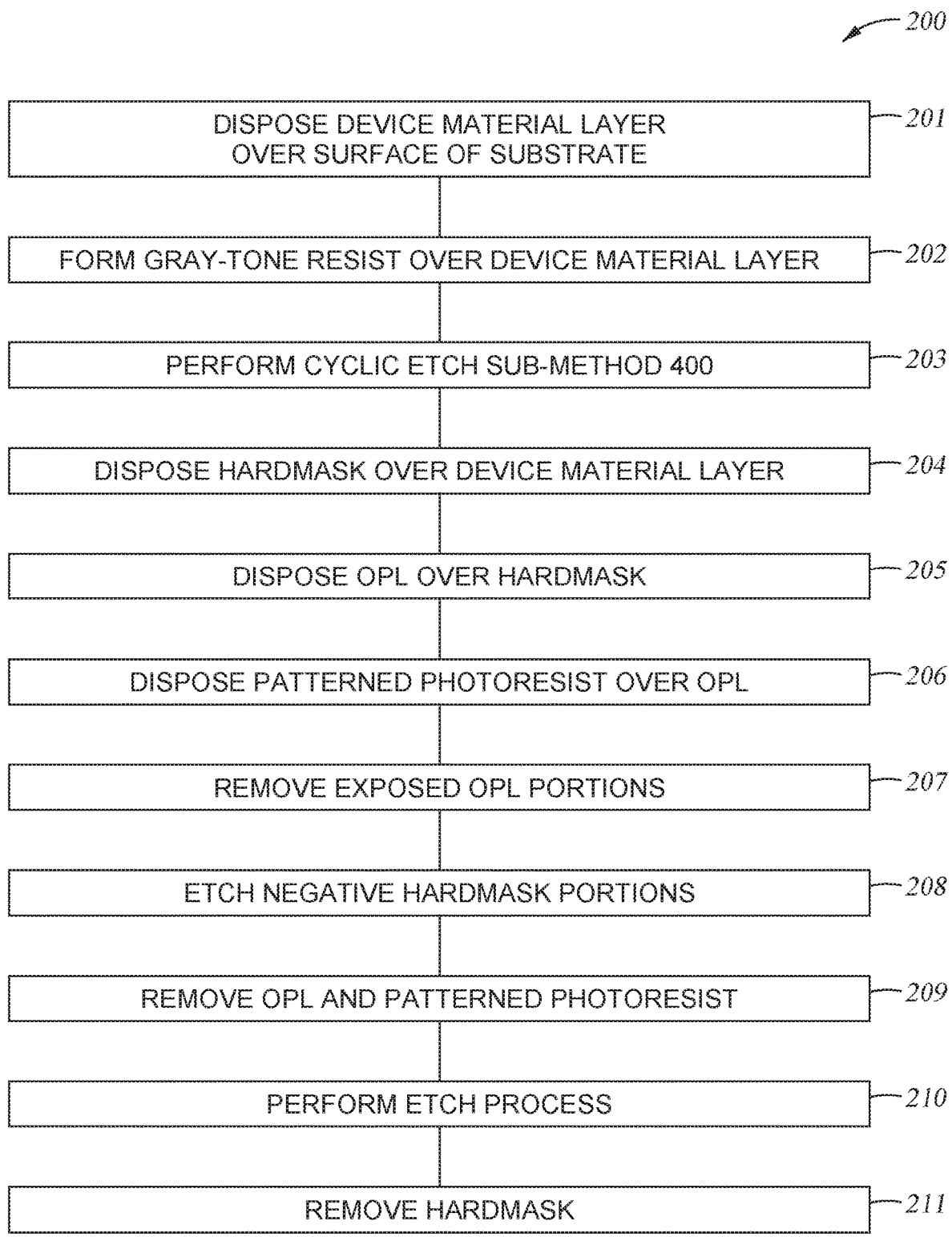
FIG. 2 is a flow diagram of a method for forming a device structure according to an embodiment.
Figure 3A:
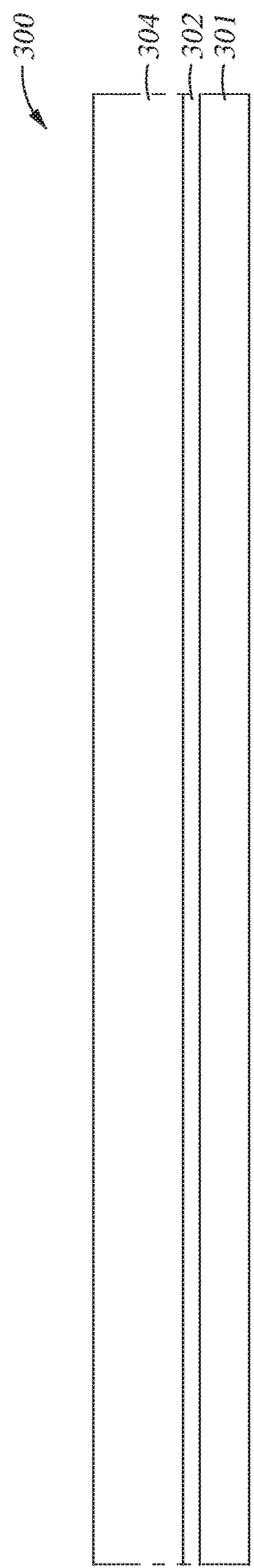

FIG. 2 is a flow diagram of a method 200 for forming a portion of optical device 300, shown in FIGS. 3A-3K, having variable-depth device structures, which correspond with grating areas 102a or 102b. At operation 201, a device material layer 304 is disposed over a surface of a substrate 301 as shown in FIG. 3A. The substrate 301 may be formed from any suitable material, provided that the substrate 301 can adequately transmit light in a desired wavelength or wavelength range and can serve as an adequate support for the optical device 300. In some embodiments, which can be combined with other embodiments described herein, the material of substrate 301, includes, but is not limited to, one or more silicon (Si), silicon dioxide ($SiO_2$), or sapphire containing materials. In other embodiments, which can be combined with other embodiments described herein, the material of substrate 301 includes, but is not limited to, materials having a refractive index between about 1.7 and about 2.0. In other embodiments, which can be combined with other embodiments described herein, the material of substrate 301 also serves as the device material such that a separate device material layer is not needed.

The device material layer 304 may be disposed over the surface of the substrate 301 by one or more processes, such as physical vapor deposition (PVD), chemical vapor deposition (CVD), plasma-enhanced CVD (PECVD), flowable CVD (FCVD), atomic layer deposition (ALD), or spin-on processes. In one embodiment, which can be combined with other embodiments described herein, the device material of device material layer 304 is selected based on the modulated depth and slant angle of each of the plurality of device structures 104 of the optical device 300 and the refractive index of the substrate 301. In some embodiments, which can be combined with other embodiments described herein, the device material layer 304 includes, but is not limited to, one or more silicon nitride (SiN), silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), zirconium dioxide ($ZrO_2$), or silicon carbon-nitride (SiCN) containing materials. In some embodiments, which can be combined with other embodiments described herein, the device material of the device material layer 304 may have a refractive index between about 1.5 and about 2.65. In other embodiments, which can be combined with other embodiments described herein, the device material of the device material layer 304 may have a refractive index between about 3.5 and about 4.0.

In some embodiments, which can be combined with other embodiments described herein, an etch stop layer 302 may be optionally disposed on the surface of the substrate 301 between the substrate 301 and the device material layer 304. The etch stop layer 302 may be disposed by one or more PVD, CVD, PECVD, FCVD, ALD, or spin-on processes. The etch stop layer 302 may be formed from any suitable material, for example titanium nitride (TiN) or tantalum nitride (TaN), among others, provided that the etch stop layer 302 is resistant to the etching processes described herein. In one embodiment, which can be combined with other embodiments described herein, the etch stop layer 302 is a non-transparent etch stop layer. In another embodiment, the etch stop layer 302 is a transparent etch stop layer.

Figure 3B:
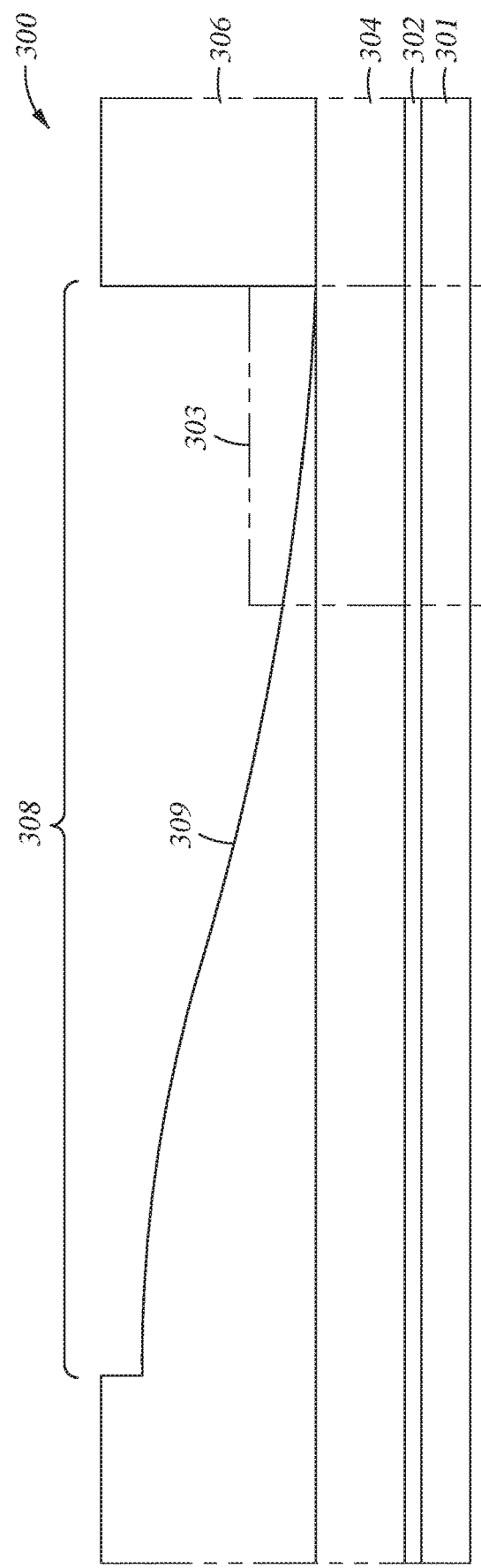

At operation 202, a gray-tone resist 306 is formed over the device material layer 304, as shown in FIG. 3B. In one embodiment, forming the gray-tone resist 306 includes disposing a resist material over the device material layer 304 and developing the resist material utilizing a lithography process. In one embodiment, which can be combined with other embodiments described herein, the lithography process is a gray-tone lithography process. The lithography process forms a gray-tone pattern 308 of the gray-tone resist 306. The resist material may include but is not limited to, light-sensitive polymer containing materials. Developing the resist material may include performing a lithography process, such as photolithography, digital lithography, or by performing laser ablation. In some embodiments, which can be combined with other embodiments described herein, the gray-tone pattern 308 of the gray-tone resist 306 may include, but is not limited to, any one-, two-, or three-dimensional shape created in the resist material using lithography or laser ablation. In yet another embodiment, which can be combined with other embodiments described herein, as shown in FIG. 3B, a surface 309 of the gray-tone pattern 308 is graded. The shape of the gray-tone pattern 308 of the gray-tone resist 306 determines the variable depth of the depth D of the device structures 104 across the substrate 301, as shown in FIGS. 3H-3K.

Figure 4:
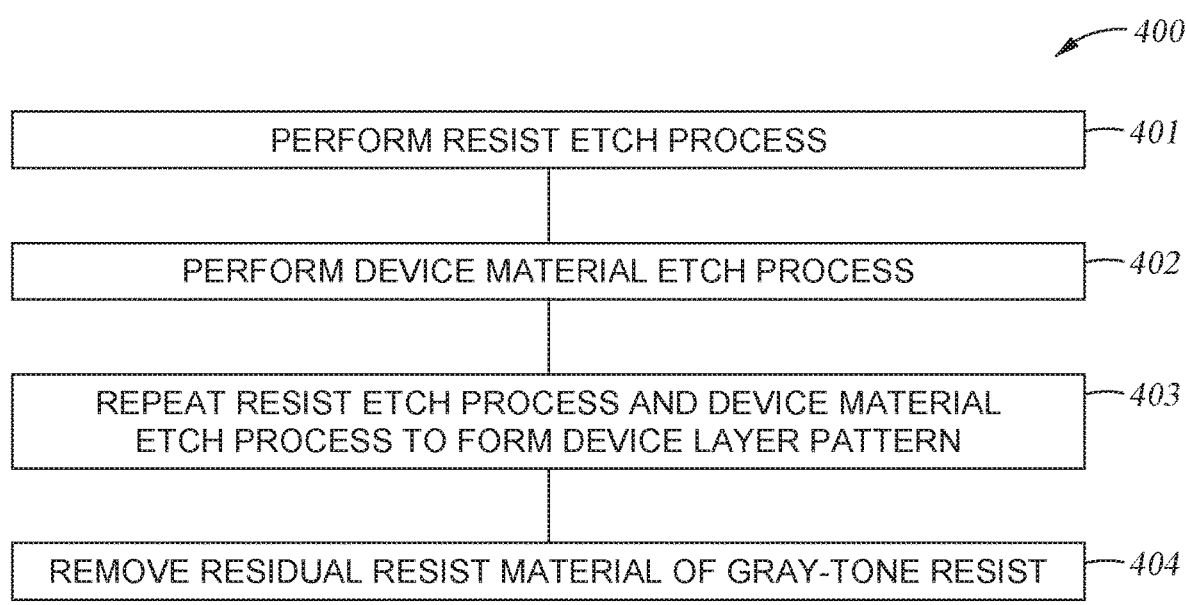
FIG. 4 is a flow diagram of a cyclic etch sub-method according to an embodiment.
Figure 5A:
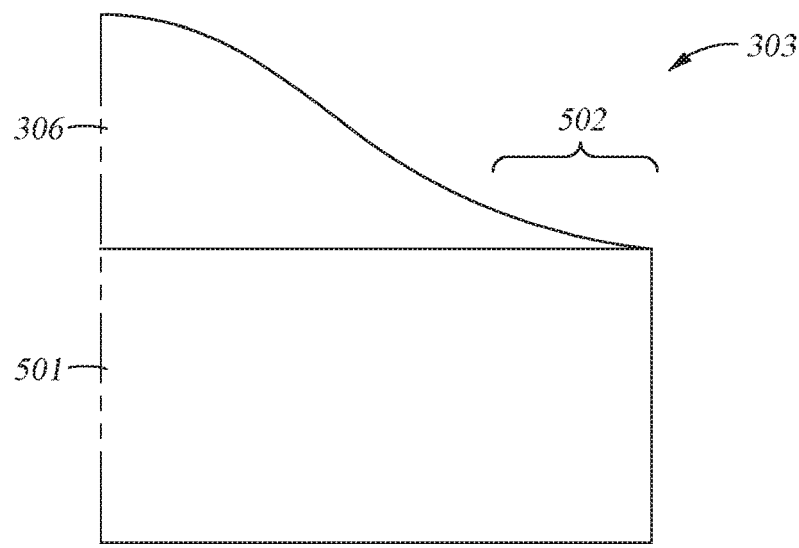
FIGS. 5A-5F are schematic, cross-sectional views of a portion of a variable-depth structure during a cyclic etch sub-method according to an embodiment.
Figure 5B:
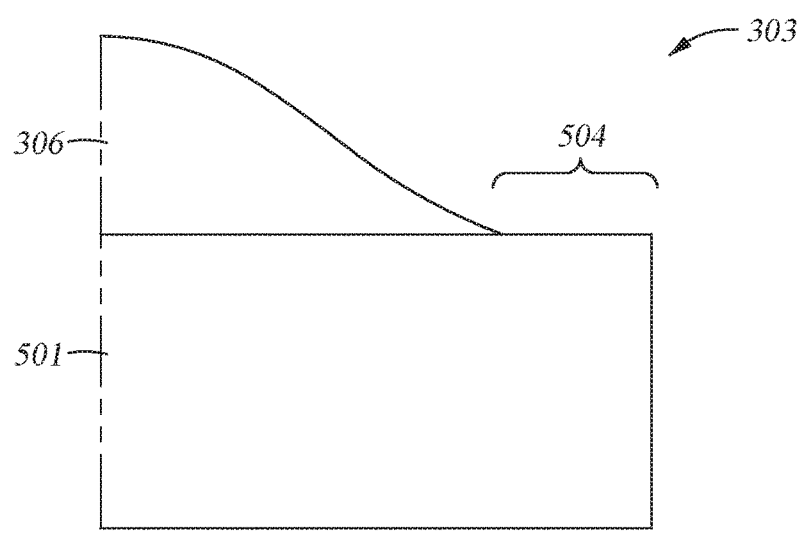

In this embodiment, at operation 203, a cyclic etch sub-method 400 is performed. FIG. 4 is a flow diagram of the cyclic etch sub-method 400. FIGS. 5A-5F are schematic, cross-sectional views of a section 303 shown in FIG. 3B, of the substrate 301 during the cyclic etch sub-method 400. At operation 401, a resist segment 502 of the gray-tone resist 306 is etched via a resist etch process, selective to the device material layer 304, to expose a device material segment 504, as shown in FIGS. 5A-5B. In one embodiment, which can be combined with other embodiments described herein, a material layer 501 is the device material layer 304. In one embodiment, which can be combined with other embodiments described herein, the material layer 501 is the substrate 301, the substrate 301 having material characteristics suitable to serve as device material so that a separate device material layer is not needed. In one embodiment, which can be combined with other embodiments described herein, the substrate 301 includes one or more silicon oxycarbide (SiOC), titanium dioxide (TiO2), silicon dioxide (SiO2), vanadium (IV) oxide (VOx), aluminum oxide (Al2O3), indium tin oxide (ITO), zinc oxide (ZnO), tantalum pentoxide (Ta2O5), silicon nitride (Si3N4), zirconium dioxide (ZrO2), or silicon carbon-nitride (SiCN) containing materials. In some embodiments, which can be combined with other embodiments described herein, the substrate 301 may have a refractive index between about 1.5 and about 2.65, for example between 1.7 and 2.0. In other embodiments, which can be combined with other embodiments described herein, the substrate 301 may have a refractive index between about 3.5 and about 4.0.

Figure 5C:
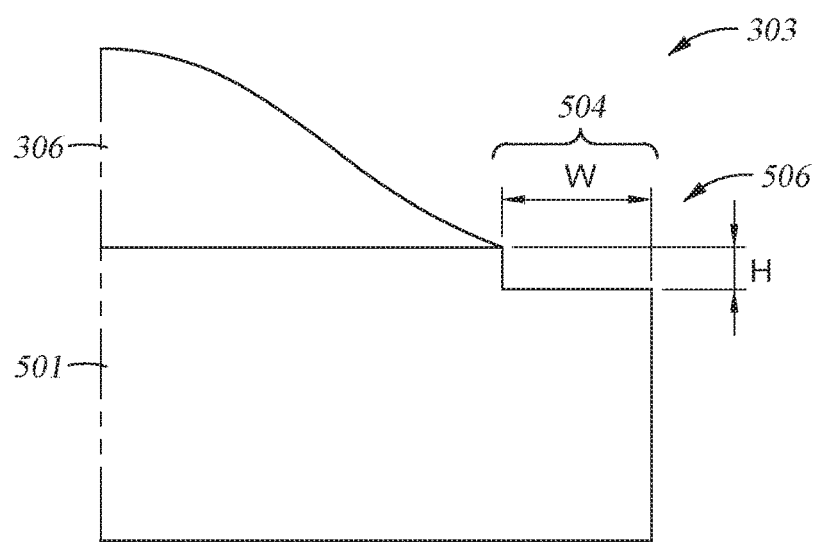
Figure 5D:
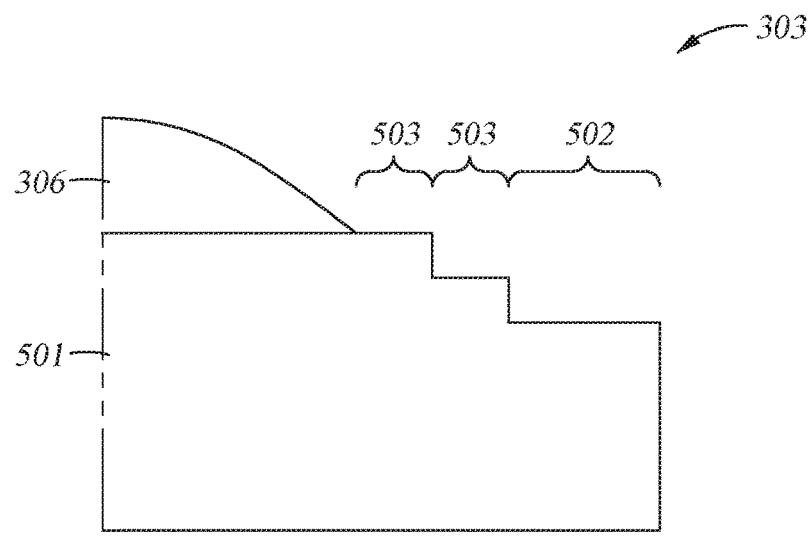
Figure 5E:
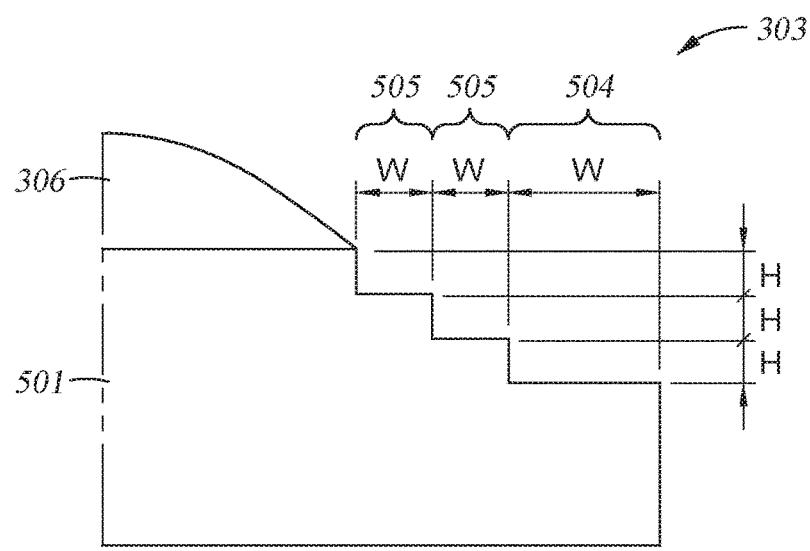
Figure 5F:
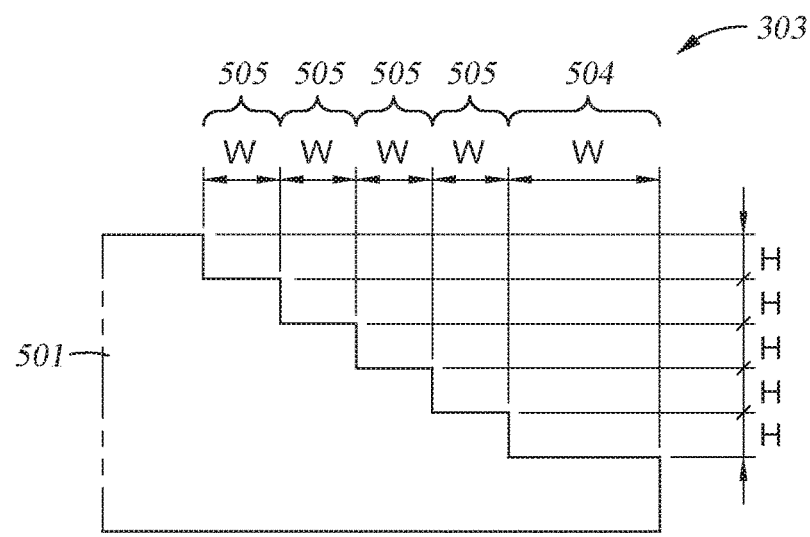

At operation 402, the device material segment 504 is partially etched via a device material etch process. In the embodiments of the method 200, the device material etch process is a device pattern etch process, selective to the material of the gray-tone resist 306, to remove a portion 506 of device material of the device material segment 504. The device material segment 504 having the portion 506 removed includes a width W and a height H, as shown in FIG. 5C. At operation 403, operations 401 and 402 are repeated for subsequent resist segments 503 and subsequent device material segments 505, as illustrated in FIGS. 5D-5F, corresponding to the gray-tone pattern 308 of FIG. 3B. In some embodiments, which can be combined with other embodiments described herein, each of the resist segments 502, 503 to be etched via the resist etch process is exposed by a first proximity mask, and each of the device material segments 504, 505 to be etched via the device material etch process is exposed by a second proximity mask. At optional operation 404, residual resist material of the gray-tone resist 306 disposed on the device material layer 304 is removed.

The resist etch process is selective to the device material, i.e., during the resist etch process, the resist material is removed at a higher rate than the device material. The resist etch process may include, but is not limited to, at least one of ion implantation, ion beam etching (IBE), reactive ion etching (RIE), directional RIE, plasma etching, thermal atomic layer etching, or laser ablation. In some embodiments, which can be combined with other embodiments described herein, the resist etch process utilizes oxidizing etch chemistries. In other embodiments, which can be combined with other embodiments described herein, the resist etch process utilizes reducing etch chemistries. In one embodiment, which can be combined with other embodiments described herein, the resist etch process utilizes one or more oxygen, nitrogen gas ($N_2$), hydrogen gas ($H_2$), $SiO_2$, or ammonia ($NH_3$) containing gases. The etch chemistry of the one or more oxygen, $N_2$, $H_2$, $SiO_2$, or $NH_3$ containing gases provides for a selectivity of the resist material to the device material of about 10:1 to about 1000:1. The etch chemistry of the one or more oxygen, $N_2$, $H_2$, $SiO_2$, or $NH_3$ containing gases with the addition of fluorine provides for a selectivity of the resist material to the device material of greater than 1:1. In another embodiment, which can be combined with other embodiments described herein, a chlorine containing gas, such as HCl, is used as an etchant. The chlorine containing gas is optionally delivered to a processing environment with a hydrogen containing gas, such as $H_2$, or an oxygen containing gas, such as $O_2$. The etch chemistry of the chlorine containing gas provides for a selectivity of the resist material to the device material of about 1:1 to about 10:1.

The device pattern etch process is selective to the resist material, i.e., during the device pattern etch process, the device material is removed at a higher rate than the resist material. The device pattern etch process may include, but is not limited to, at least one of ion implantation, IBE, RIE, directional RIE, plasma etching, thermal atomic layer etching, or laser ablation. In some embodiments, which can be combined with other embodiments described herein, the device pattern etch process has a selectivity of the resist material to the device material of about 1:1 to about 10:1. In some embodiments, which can be combined with other embodiments described herein, a fluorine containing gas, such as fluoromethane ($CH_3F$), sulfur hexafluoride (SF6), tetrafluoromethane ($CF_4$), fluoroform ($CHF_3$), or nitrogen trifluoride ($NF_3$), is used as an etchant. The fluorine containing gas is optionally delivered to a processing environment with a methane containing gas, such as methane ($CH_4$) and/or dichlorodifluoromethane ($CCl_2F_2$).

As shown in FIG. 3C, removing the removing portions 506 of device material of the device material segments 504, 505 forms a device layer pattern 310 having a variable-depth surface 312. The variable-depth surface 312 of the device layer pattern 310 has a gradient corresponding to the width W and the height H of each of the device material segments 504, 505. In one embodiment, which can be combined with other embodiments described herein, the width W and the height H of each of the device material segments 504, 505 is substantially the same. In another embodiment, which can be combined with other embodiments described herein, at least one of the width W and the height H of at least one device material segment is different from the device material segments 504, 505. The gradient of the variable-depth surface 312 may match a pitch 326 of the device structures 104 (shown in FIGS. 3H-3K) formed via the method 200. Matching the variable-depth surface 312 to the pitch 326 of the device structures 104 to be formed results in the device structures 104 having a continuous gradient.

At operation 204, a hardmask 314 is disposed over the device material layer 304. The results of operation 204 are illustrated in FIG. 3D. The hardmask 314 may be disposed over the device material layer 304 by one or more liquid material pour casting, spin-on coating, liquid spray coating, dry powder coating, screen printing, doctor blading, PVD, CVD, PECVD, FCVD, ALD, evaporation, or sputtering processes. In one embodiment, which can be combined with other embodiments described herein, the hardmask 314 is non-transparent and is removed after the portion of the optical device 300 is formed. In another embodiment, the hardmask 314 is transparent. In some embodiments, which can be combined with other embodiments described herein, the hardmask 314 includes, but is limited to, chromium (Cr), silver (Ag), $Si_3N_4$, $SiO_2$, TiN, or carbon (C) containing materials. The hardmask 314 can be deposited so that the thickness of the hardmask 314 is substantially uniform. In yet other embodiments, the hardmask 314 can be deposited so that the thickness varies from about 30 nm and about 50 nm at varying points on the device material layer 304. The hardmask 314 is deposited in such a way that the slope of the hardmask 314 is similar to the slope of the variable-depth surface 312.

Figure 3E:
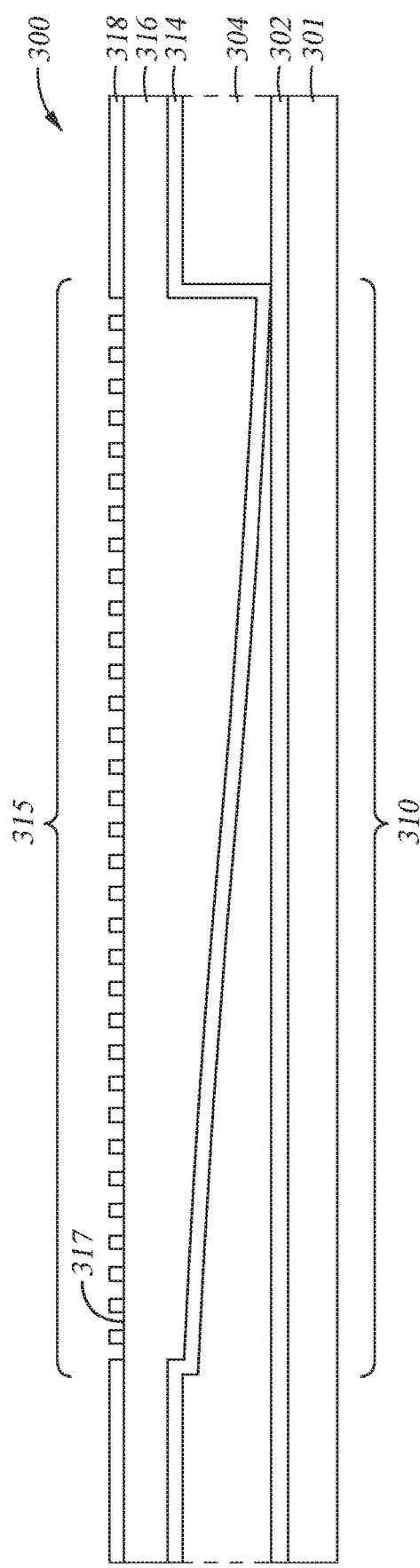

At operation 205, an organic planarization layer (OPL) 316 is disposed over the hardmask 314. The results of operation 205 are illustrated in FIG. 3E. The OPL 316 may include a photo-sensitive organic polymer comprising a light-sensitive material that, when exposed to electromagnetic (EM) radiation, is chemically altered and thus configured to be removed using a developing solvent. The OPL 316 may include any organic polymer and a photo-active compound having a molecular structure that can attach to the molecular structure of the organic polymer. In one embodiment, which can be combined with other embodiments described herein, the OPL 316 may be disposed using a spin-on coating process. In another embodiment, which can be combined with other embodiments described herein, the OPL 316 may include, but is not limited to, one or more of polyacrylate resin, epoxy resin, phenol resin, polyamide resin, polyimide resin, unsaturated polyester resin, polyphenylenether resin, polyphenylenesulfide resin, or benzocyclobutene (BCB).

As illustrated in FIG. 3E, the OPL 316 varies in thickness, such that a substantially planar top surface is formed. The OPL 316 varies in thickness, such that the space between the sloped conformal hardmask 314 and the substantially planar top surface of the OPL 316 is completely filled and has a varying thickness over the sloped variable-depth surface 312.

Figure 3F:
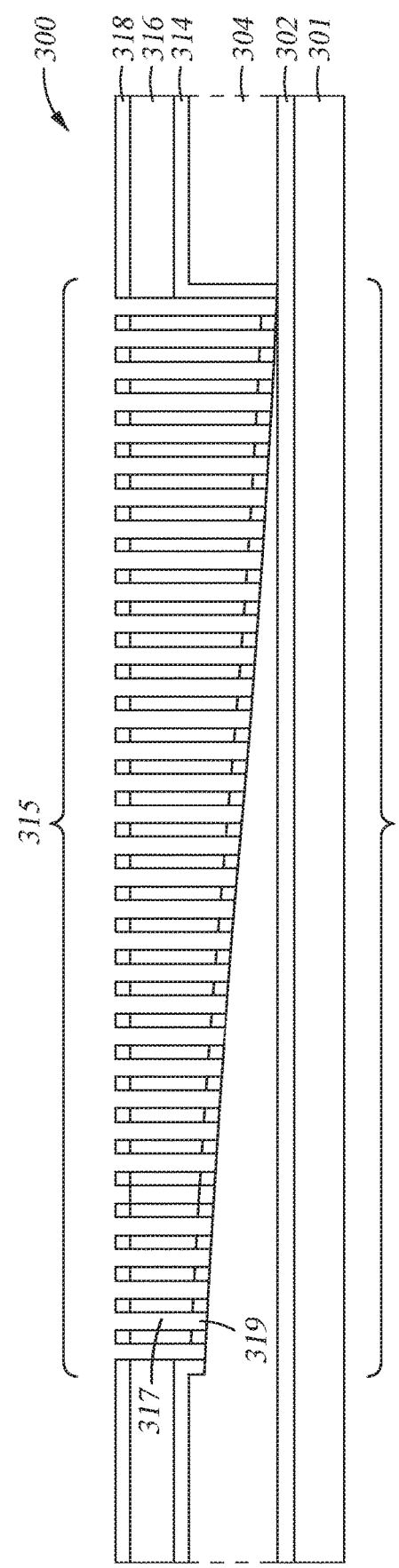
Figure 3G:
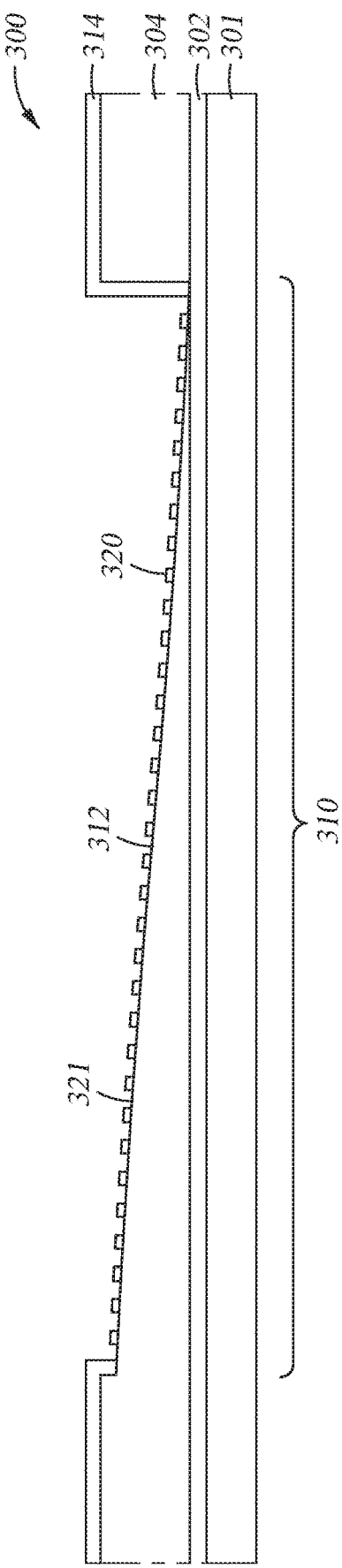

Referring to FIGS. 3E-3K, at operation 206, a patterned photoresist 318 is disposed over the OPL 316. The patterned photoresist 318 is formed by disposing a photoresist material on the OPL 316 and developing the photoresist material. The patterned photoresist 318 defines a hardmask pattern 315, illustrated in FIG. 3E, that corresponds to exposed segments 321 of the device material layer 304, as illustrated in FIG. 3G. The exposed segments 321, as shown in 3G, of the device material layer 304 to be etched correspond to gaps 324 between the device structures 104, as illustrated in FIG. 3H-3K. In one embodiment, which can be combined with other embodiments described herein, the photoresist material may be disposed on the OPL 316 using a spin-on coating process. In another embodiment, which can be combined with other embodiments described herein, the patterned photoresist 318 may include, but is not limited to, light-sensitive polymer containing materials. Developing the photoresist material may include performing a lithography process, such as photolithography and digital lithography.

At operation 207, OPL portions 317 of the OPL 316 exposed by the hardmask pattern 315 are removed. Removing the OPL portions 317 exposes negative hardmask portions 319 of the hardmask pattern 315 that correspond to the gaps 324 between the device structures 104. The OPL portions 317 may be removed by IBE, RIE, directional RIE, plasma etching, wet etching, and/or lithography. The results of operation 207 are illustrated in FIG. 3F.

At operation 208, the negative hardmask portions 319 of the hardmask pattern 315 are etched. The results of operation 208 are shown in FIG. 3F. Etching the negative hardmask portions 319 exposes the exposed segments 321 of the device material layer 304 corresponding to the hardmask pattern 315. In one embodiment, which can be combined with other embodiments described herein, etching the negative hardmask portions 319 may include, but is not limited to, at least one of IBE, RIE, directional RIE, or plasma etching.

At operation 209, the patterned photoresist 318 and the OPL 316 are removed. The results of operation 208 are illustrated in FIG. 3G. Stripping the OPL 316 and the patterned photoresist 318 yields a set of hardmask portions 320.

Figure 3H:
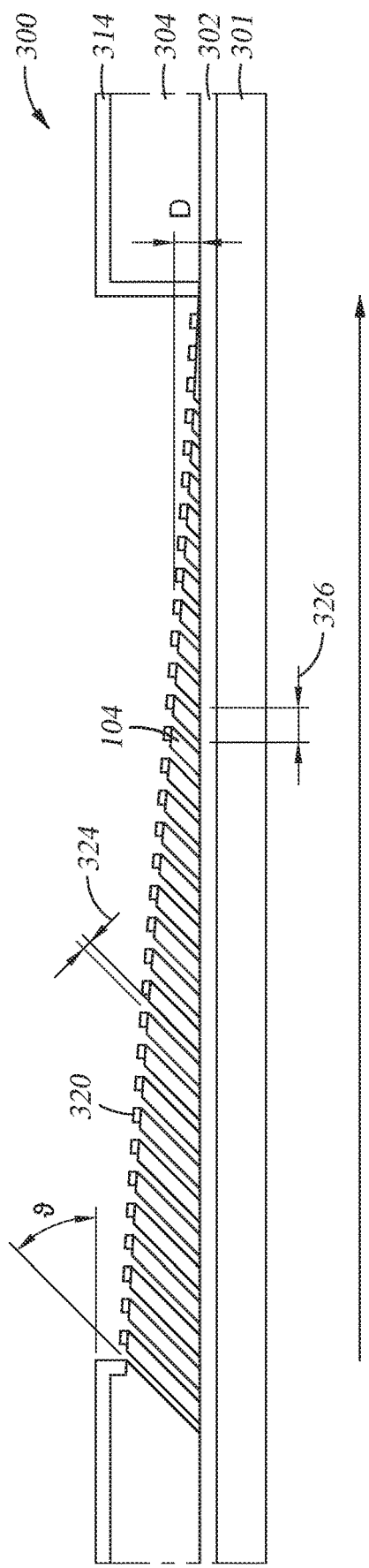
Figure 3I:
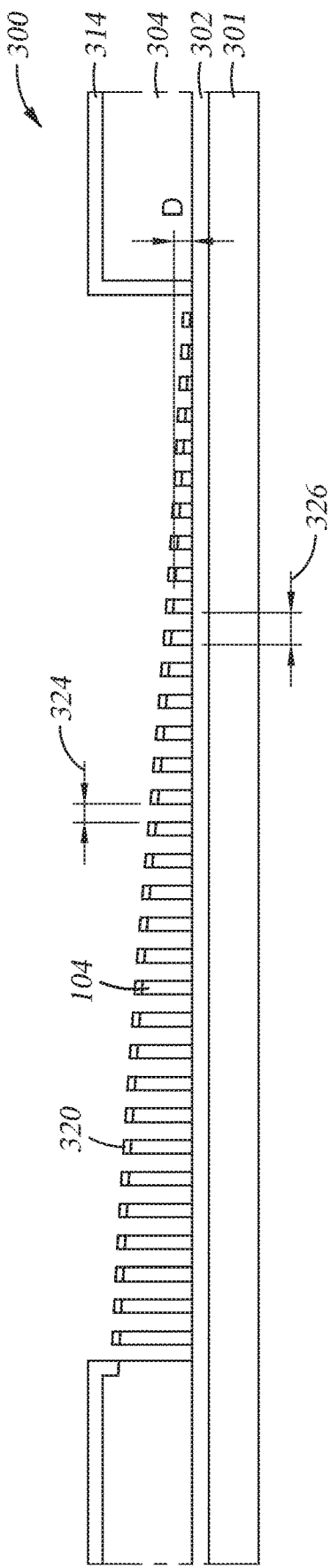
Figure 3J:
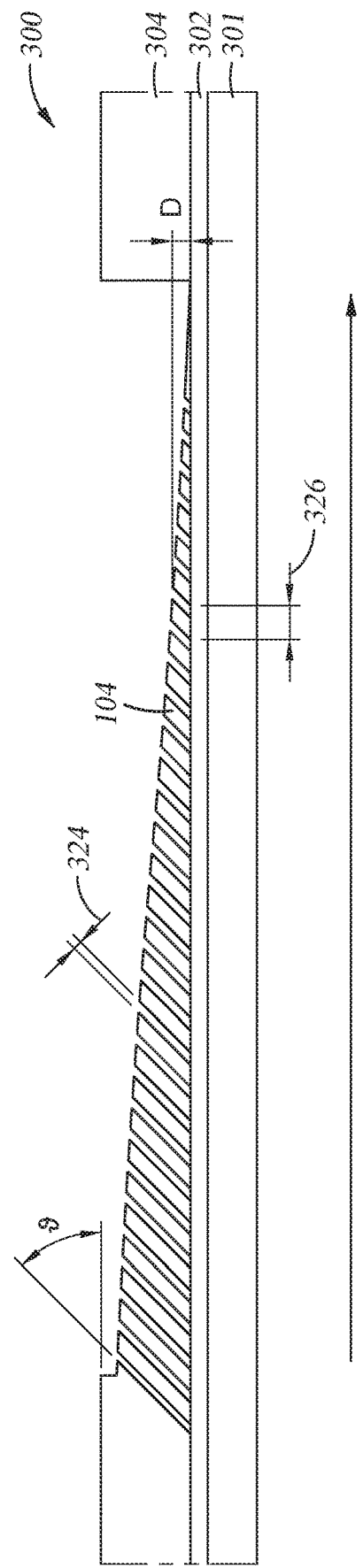

At operation 210, a etch process is performed. In one embodiment, which can be combined with other embodiments described herein, an angled etching process is performed. The angled etch process may include, but is not limited to, at least one of IBE, RIE, directional RIE, or laser ablation. The ion beam generated by IBE may include, but is not limited to, at least one of a ribbon beam, a spot beam, or a full substrate-size beam. Performing the angled etch process etches the exposed segments 321 of the device material layer 304 to form a plurality of device structures 104. As shown in FIGS. 3H and 3J, the angled etching process forms the plurality of device structures 104 such that the device structures 104 have a slant angle ϑ relative to the surface of the substrate 301. In one embodiment, which can be combined with other embodiments described herein, the slant angle ϑ of each of the device structures 104 is substantially the same. In another embodiment, which can be combined with other embodiments described herein, the slant angle ϑ of at least one device structure of the plurality of device structures 104 is different.

Figure 3K:
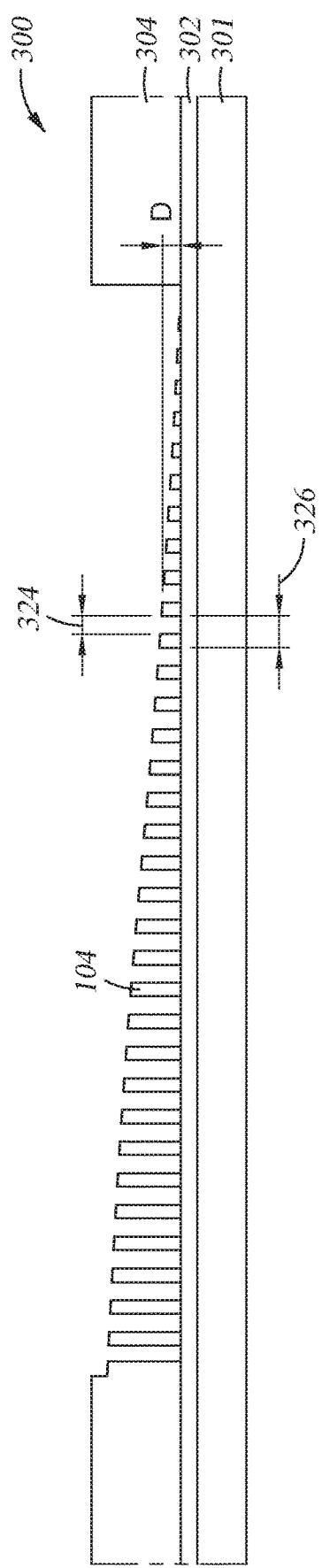

In another embodiment, which may be combined with other embodiments described herein, the etch process includes an isotropic (i.e., vertical) etch process. The isotropic etch process may include, but is not limited to, at least one of ion implantation, IBE, RIE, plasma etching, thermal atomic layer etching, or laser ablation. As shown in FIGS. 3I and 3K, the isotropic etch process forms the plurality of device structures 104 with a slant angle ϑ relative to the surface of the substrate 301 that is about 90 degrees, i.e., each of the device structures 104 is substantially perpendicular to the surface of the substrate 301.

The device layer pattern 310 provides for the depth D of the device structures 104 to have variable depth across the substrate 301. For example, as shown in FIGS. 3H-3K, the depth D of the device structures 104 decreases in the X-direction across the substrate 301. In one embodiment, which can be combined with other embodiments described herein, the gradient of the depth D of the device structures 104 is continuous. In one embodiment, which can be combined with other embodiments described herein, the gradient of the depth D of the device structures 104 is step-wise. As described above, modulating the depth D of the device structures 104 provides for control of the propagated light by gratings 102 of the optical device 100. At optional operation 211, the hardmask 314 is removed as shown in FIGS. 3J and 3K.

Figure 3L:
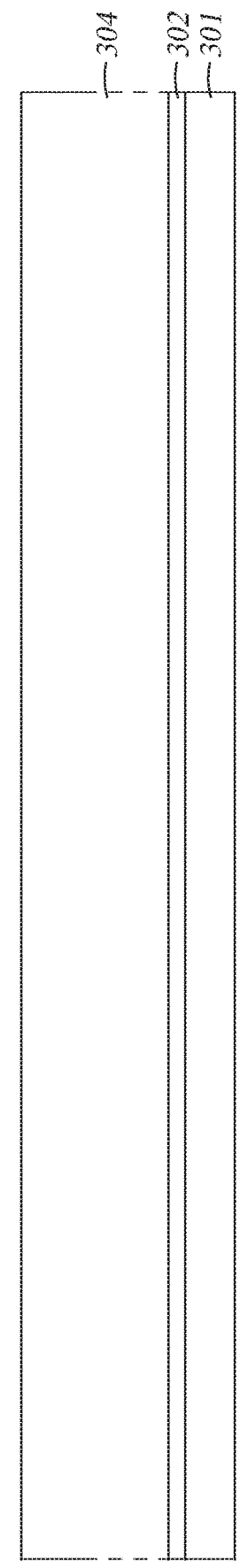
FIGS. 3L-3V are schematic, cross-sectional views of a portion of a variable-depth structure according to an embodiment.
Figure 3M:
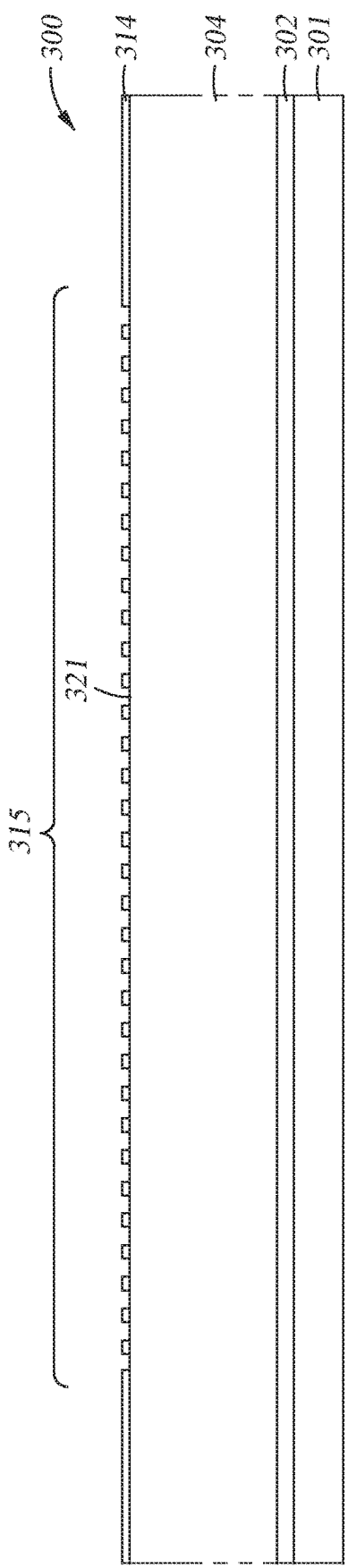
Figure 3N:
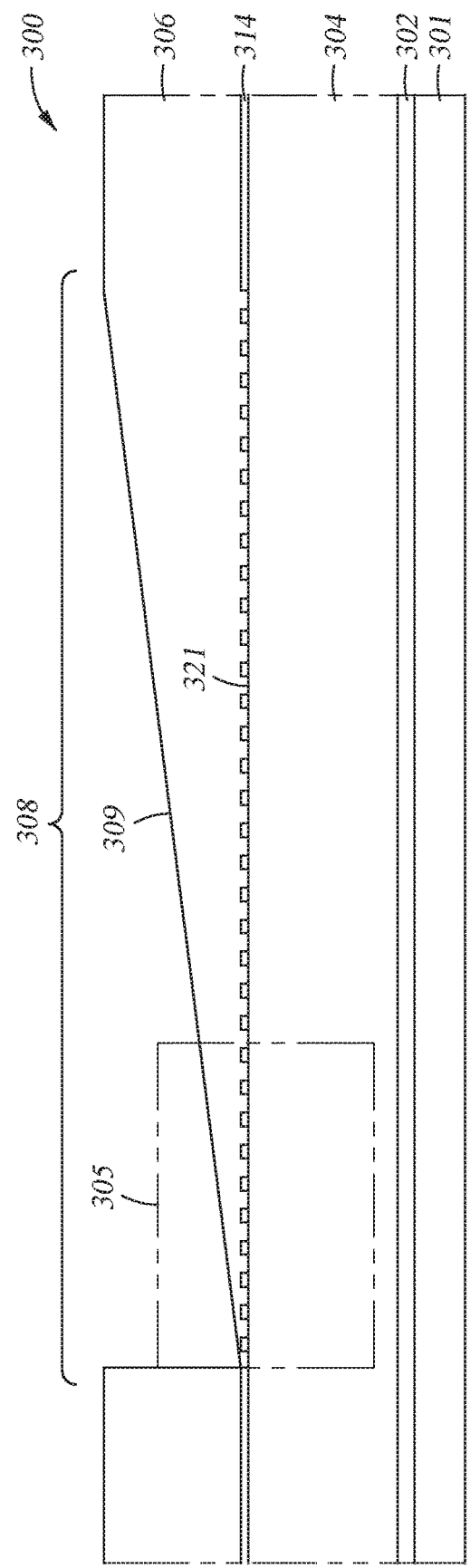
Figure 3O:
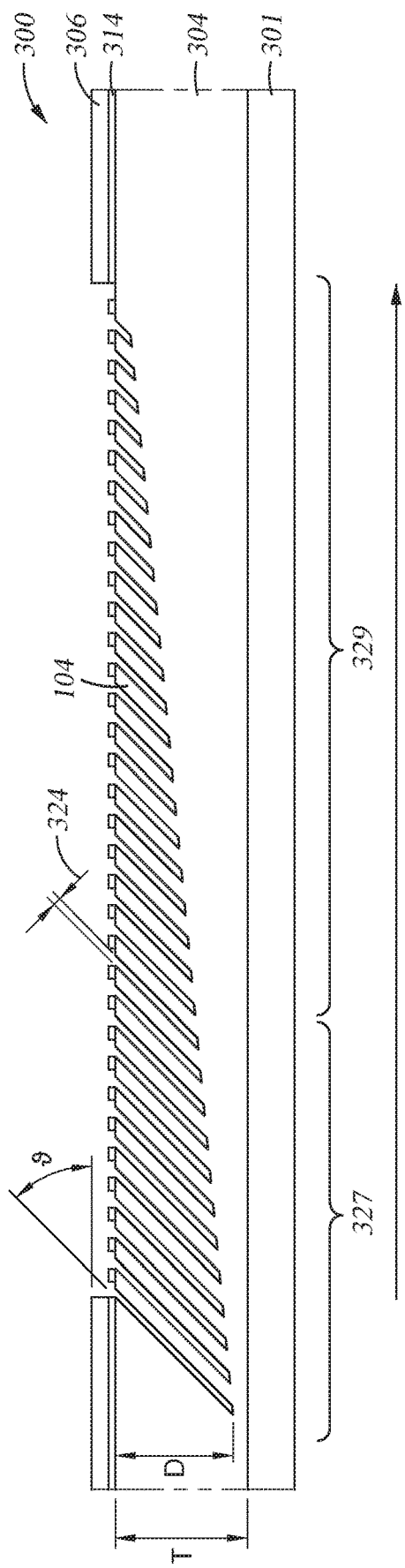
Figure 3P:
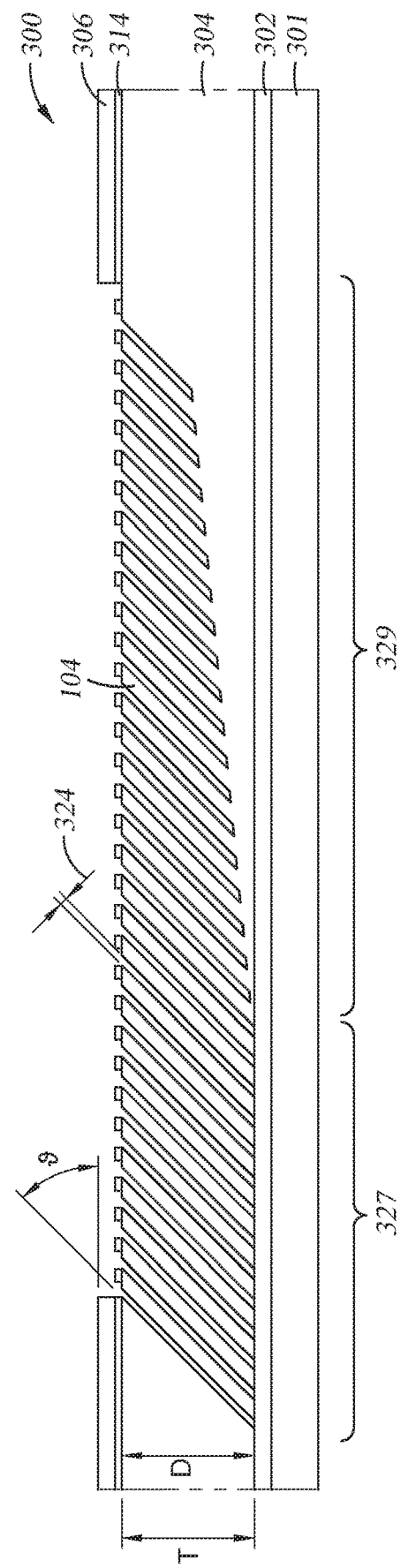
Figure 3Q:
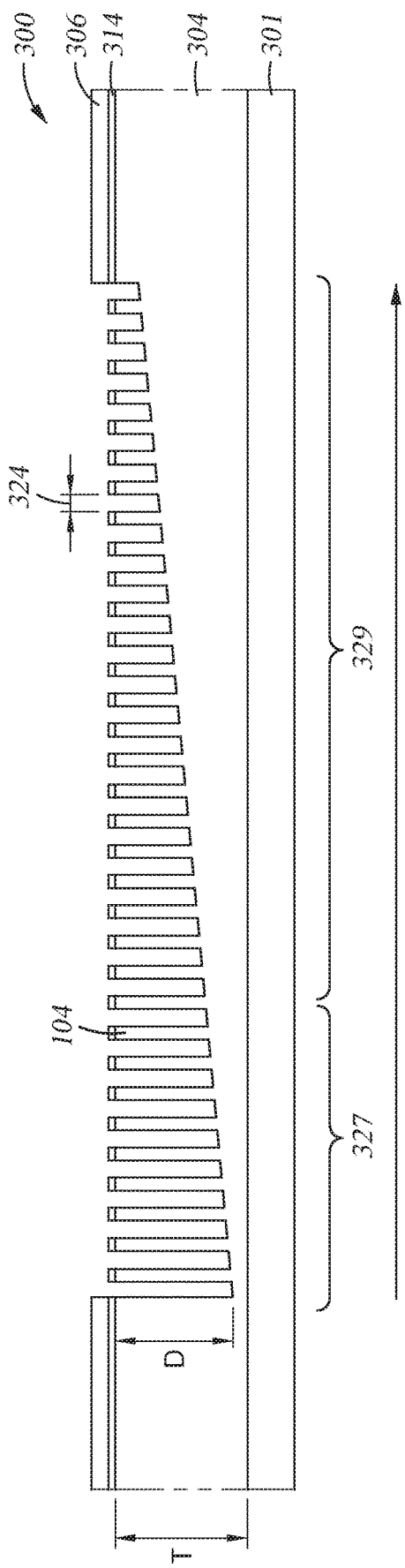
Figure 3R:
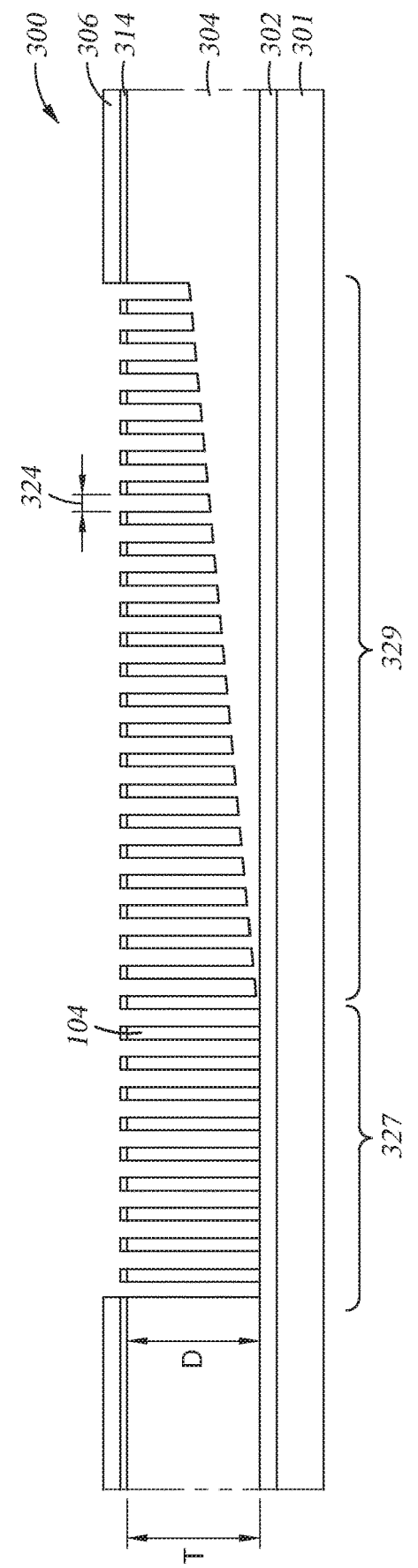
Figure 3S:
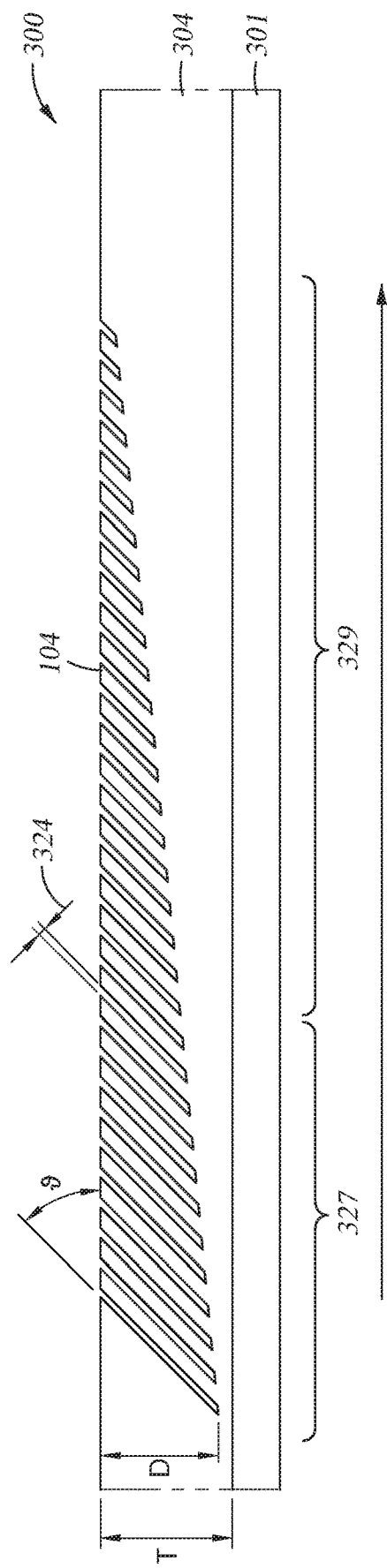
Figure 3T:
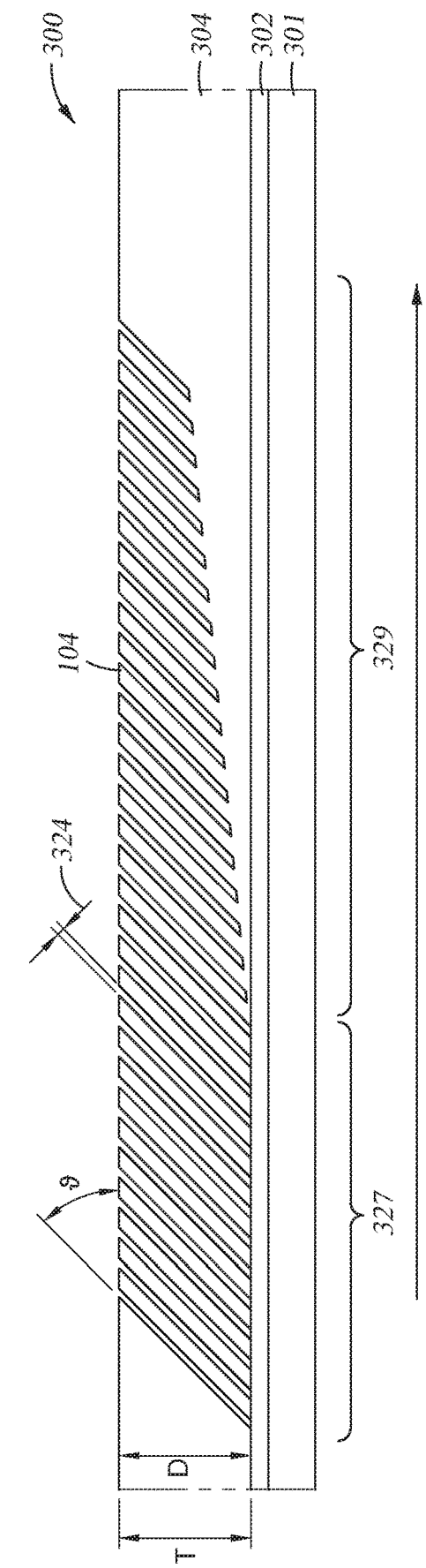
Figure 3U:
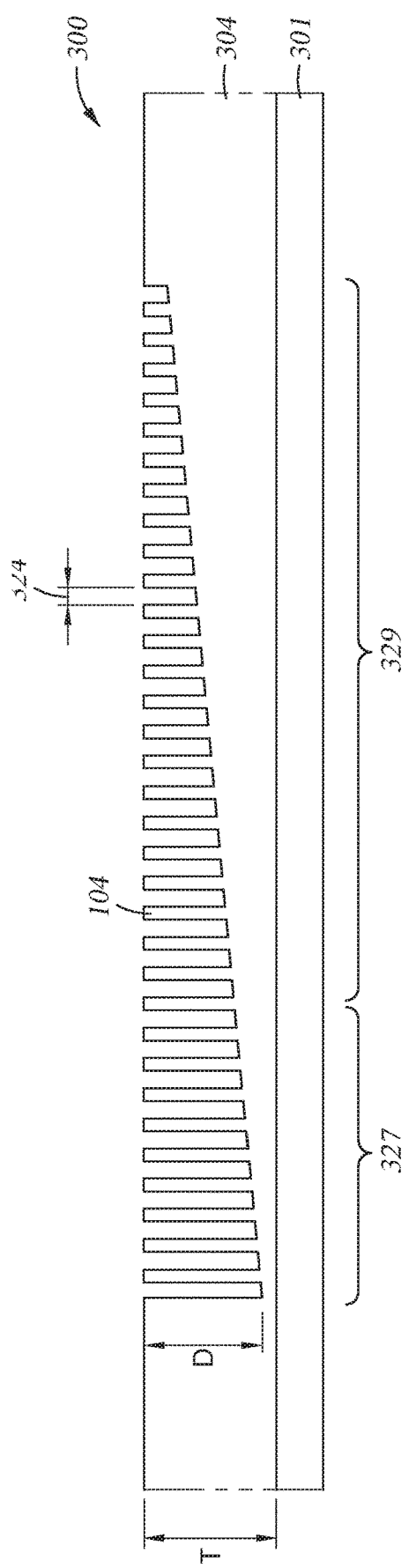
Figure 3V:
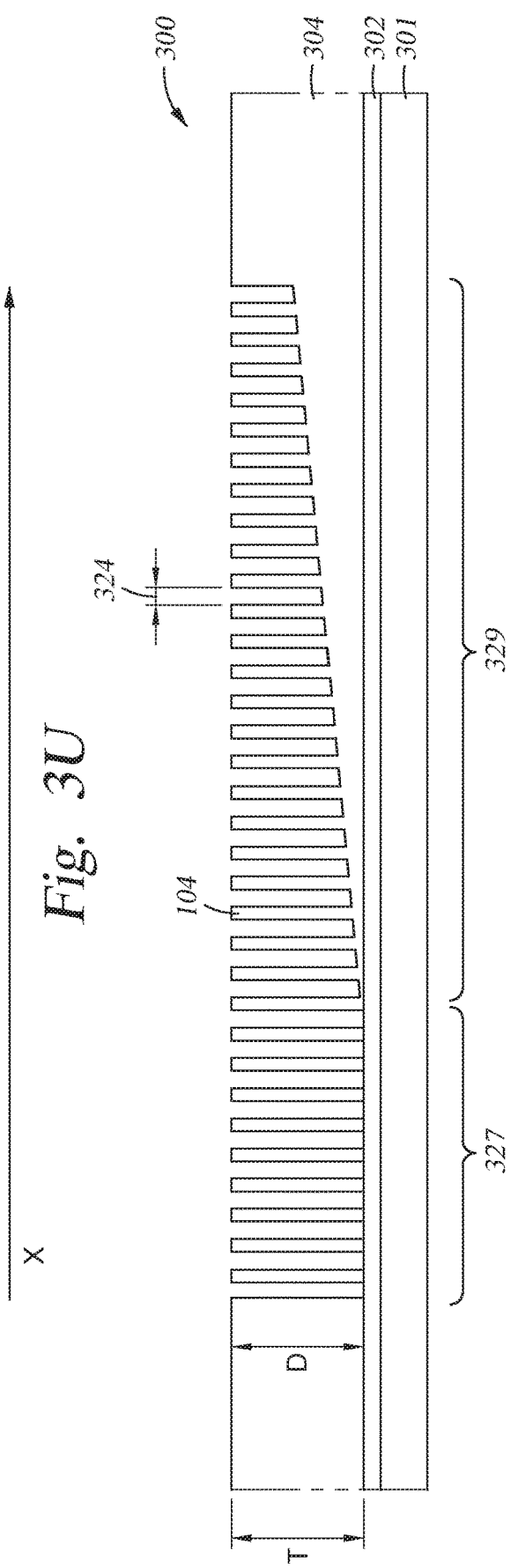
Figure 6:
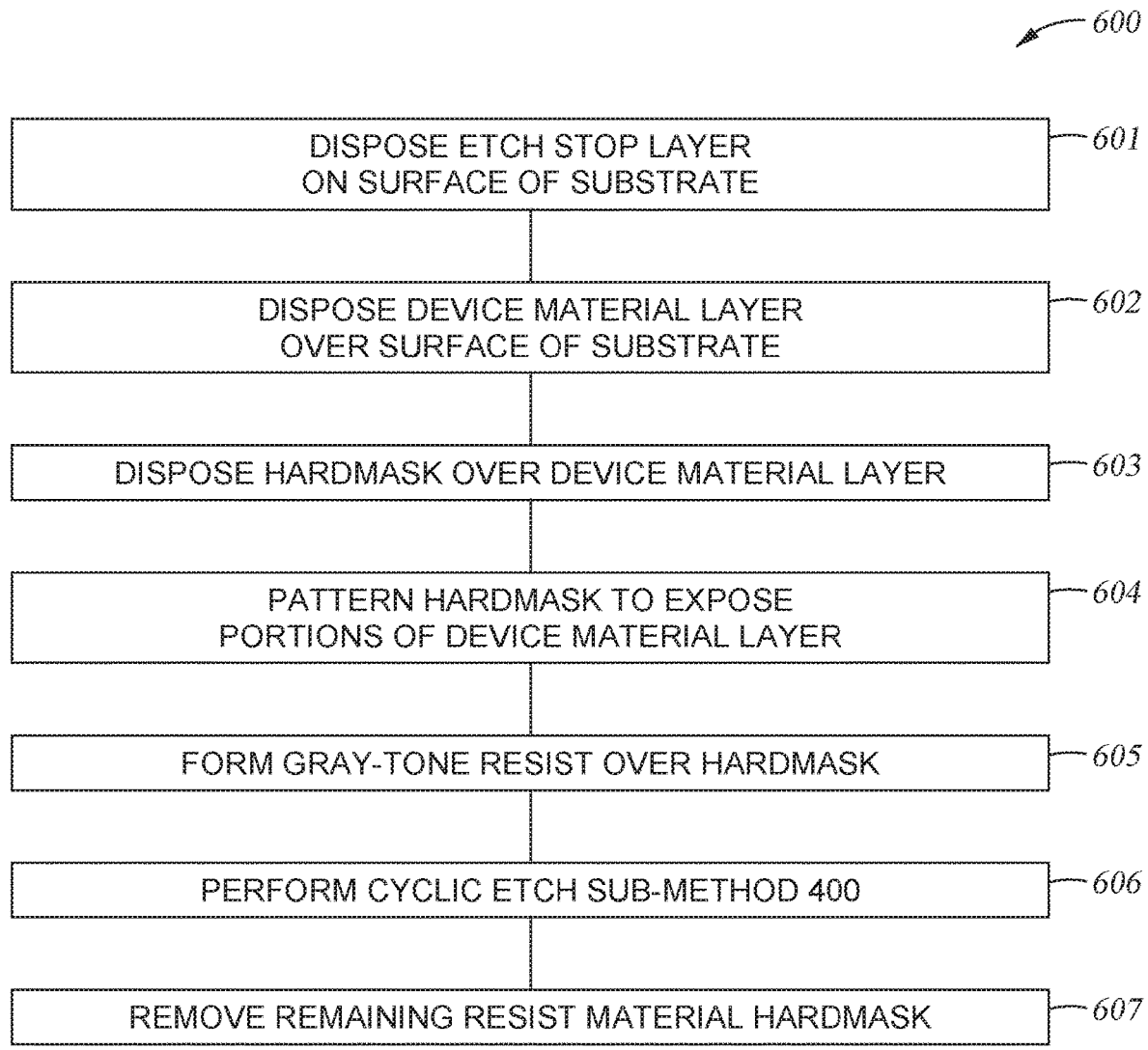
FIG. 6 is a flow diagram of a method for forming a device structure according to an embodiment.

FIG. 6 is a flow diagram of a method 600 for forming an optical device 300, shown in FIGS. 3L-3V, having variable-depth device structures 104. At optional operation 601, an etch stop layer 302 is disposed on the surface of the substrate 301. In some embodiments, which can be combined with other embodiments described herein, as shown in FIGS. 3S and 3U, an etch stop layer 302 is not necessary when the depth D of the device structures 104 is less than a thickness T of the device material layer across at least a first portion 327 and a second portion 329 of the substrate 301 In some embodiments, which can be combined with other embodiments described herein, substrate 301 has material characteristics described above and suitable to serve as device material so that a separate device material layer is not needed.

At operation 602, as shown in FIG. 3L, a device material layer 304 is disposed over a surface of the substrate 301. At operation 603, as shown in FIG. 3M, a hardmask 314 is disposed over the device material layer 304. At operation 604, the hardmask 314 is patterned to expose segments 321 of the device material layer 304. In one example (not shown), the hardmask 314 may be patterned by disposing an OPL over a layer of hardmask material on the device material layer 304, disposing a photoresist over the OPL, patterning the photoresist to expose portion of the OPL, removing the exposed portions of the OPL to expose portions of the layer of hardmask material, and removing exposed portions of the layer of hardmask material to define a hardmask pattern 315 that corresponds to exposed segments 321 of the device material layer 304. The exposed segments 321 of the device material layer 304 to be etched correspond to gaps 324 between the device structures 104 (as shown in FIGS. 3O-3V).

Figure 5G:
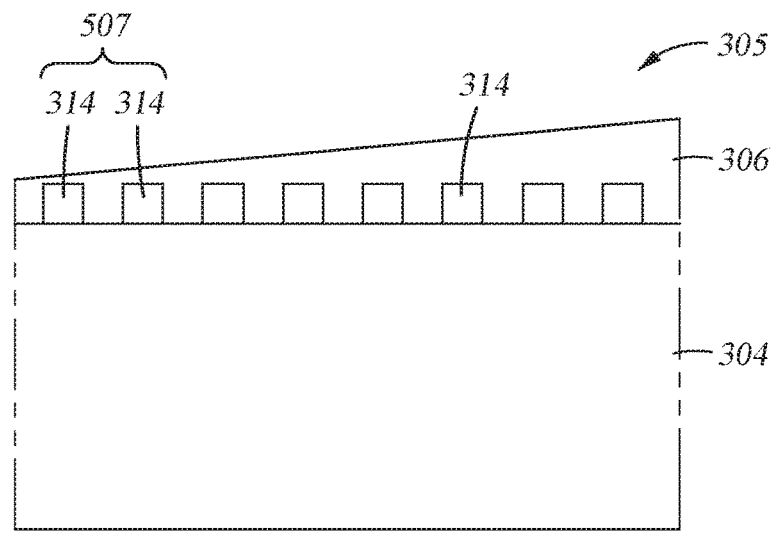
FIGS. 5G-5L are schematic, cross-sectional views of a portion of a variable-depth structure during a cyclic etch sub-method according to an embodiment.
Figure 5H:
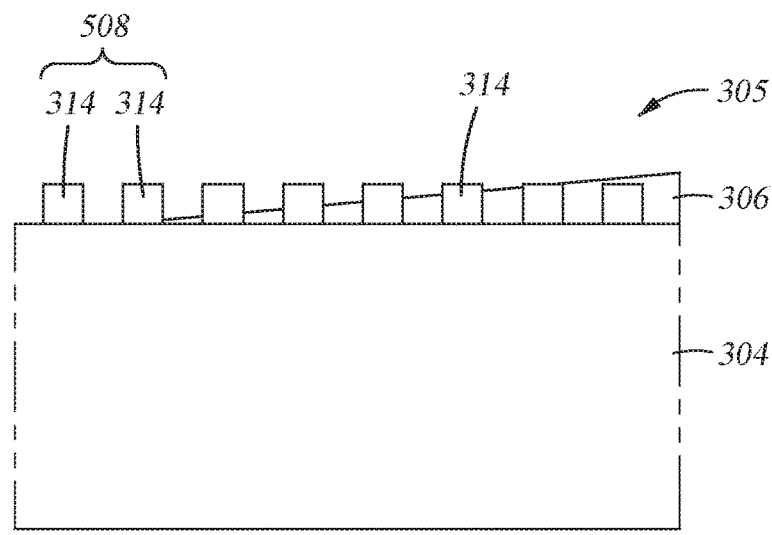
Figure 5I:
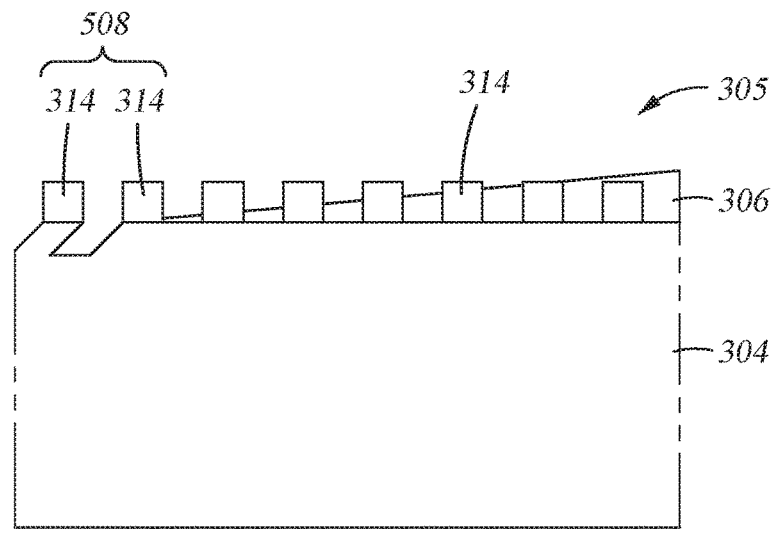
Figure 5J:
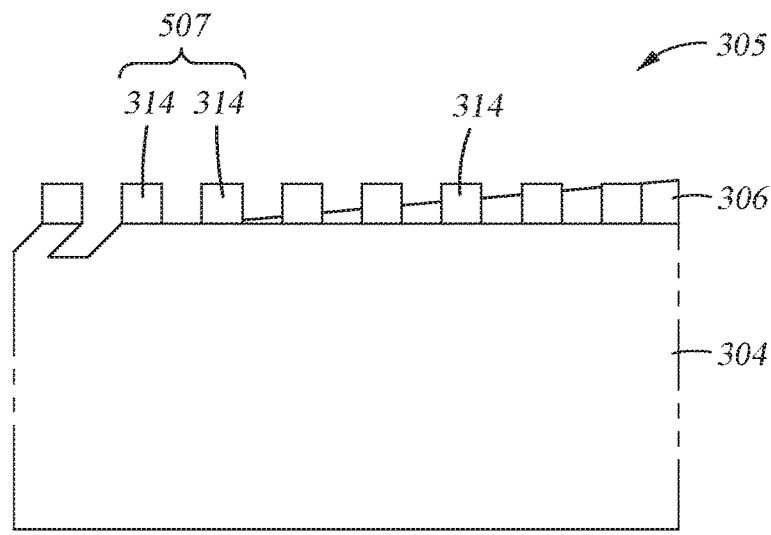
Figure 5K:
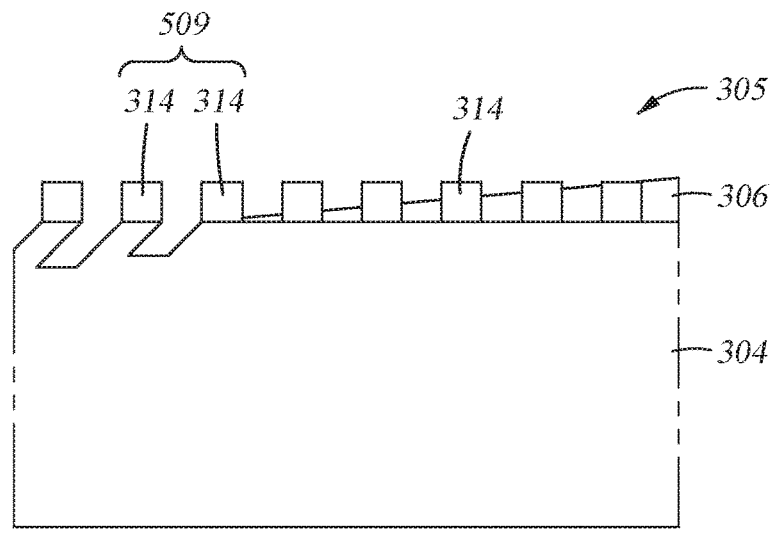
Figure 5L:
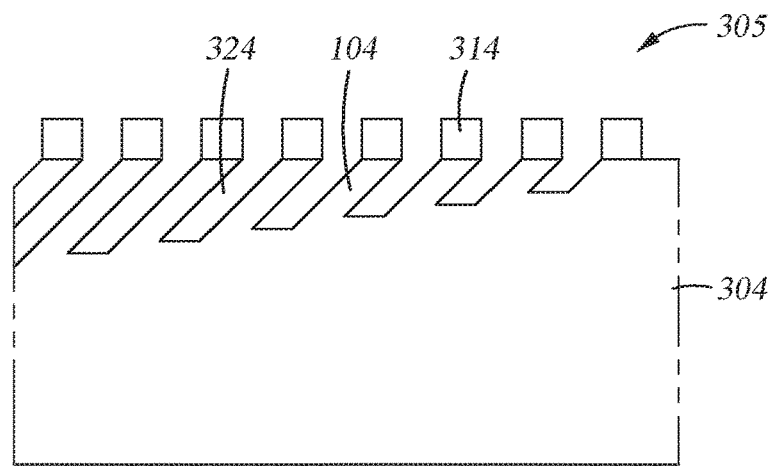

At operation 605, a gray-tone resist 306 is formed in gray-tone pattern 308 over the hardmask 314, as shown in FIG. 3N. In one embodiment, which can be combined with other embodiments described herein, as shown in FIG. 3N, a surface 309 of the gray-tone pattern 308 is graded. The shape of the gray-tone pattern 308 of the gray-tone resist 306 determines the variable depth of the depth D of the device structures 104 across the substrate 301, as shown in FIGS. 3O-3V. At operation 606, the cyclic etch sub-method 400 is performed. FIGS. 5G-5L are schematic, cross-sectional views of a section 305 (shown in FIG. 3N) of the substrate 301 during the cyclic etch sub-method 400 of the method 600. At operation 401, a resist segment 507, of the gray-tone resist 306, shown in FIG. 5G, is etched via a resist etch process, selective to the resist material, to expose a device segment 508, device segment 508 includes exposed portions of hardmask 314 and exposed portions of the device material layer 304, as shown in FIG. 5H. At operation 402, the exposed device segment 508 is etched via a device material etch process. In the embodiments of the cyclic etch sub-method 400, the device material etch process is an etch process, selective to the device material which preserves the exposed portions of hardmask 314 and removes device material from the exposed portions of the device material layer 304 of the device segment 508, as shown in FIG. 5I. At operation 403, operations 401 and 402 are repeated for subsequent resist segments 507 and subsequent exposed device segments 509, shown in FIGS. 5J-5L corresponding to the gray-tone pattern 308, shown in FIG. 3N. In some embodiments, which can be combined with other embodiments described herein, each of the resist segments 507 to be etched via the resist etch process is exposed by a first proximity mask, and each of the device segments 508, 509 to be etched via the device material etch process is exposed by a second proximity mask.

Performing the cyclic etch process etches the exposed segments 321 of the device material layer 304 to form a plurality of device structures 104. The gray-tone pattern 308 creates the variable depth D of the device structures 104 across the substrate 301. For example, as shown in FIGS. 3O-3R, the depth D of the device structures 104 decreases in the X-direction across the substrate 301. In one embodiment, which can be combined with other embodiments described herein, the depth D of the device structures 104 is less than a thickness T of the device material layer 304, as shown in FIGS. 3O and 3Q. In another embodiment, which can be combined with other embodiments described herein, the depth D of the device structures 104 is substantially equal to a thickness T of the grating material layer across a first portion 327 of the substrate 301 and the depth D of the device structures 104 is less than the thickness T of the grating material layer across a second portion 329 of the substrate, as shown in FIGS. 3P and 3R. At optional operation 404, residual resist material of the gray-tone resist 306 disposed on the hardmask 314 is removed.

In one embodiment, which may be combined with other embodiments described herein, the device material etch process includes an isotropic (i.e., vertical) etch process. The isotropic etch process may include, but is not limited to, at least one of ion implantation, IBE, RIE, plasma etching, thermal atomic layer etching, or laser ablation. As shown in FIGS. 3Q, 3R, 3U, and 3V, the isotropic etch process forms the plurality of device structures 104 with a slant angle $\vartheta$ relative to the surface of the substrate 301 that is about 90 degrees, i.e., each of the device structures is substantially perpendicular to the surface of the substrate 301. In another embodiment, which may be combined with other embodiments described herein, the device material etch process includes an angled etch process. The angled etch process may include, but is not limited to, at least one of IBE, RIE, directional RIE, and laser ablation. The angled etch process forms the plurality of device structures 104 with a slant angle $\vartheta$ relative to the surface of the substrate 301 that is greater or less than about 90 degrees. In one embodiment, which can be combined with other embodiments described herein, the slant angle $\vartheta$ of each of the device structures 104 is substantially the same. In another embodiment, which can be combined with other embodiments described herein, the slant angle $\vartheta$ of at least one device structure of the plurality of device structures 104 is different.

In some embodiments, which can be combined with other embodiments described herein, the device material etch process, as described in the device material etch process of the cyclic etch sub-method 400, has a selectivity of the resist material to the device material of about 1:1 to about 10:1. In some embodiments, which can be combined with other embodiments described herein, a fluorine containing gas, such as $CH_3F$, SF6, $CF_4$, $CHF_3$, or $NF_3$, is used as an etchant. The fluorine containing gas is optionally delivered to a processing environment with a methane containing gas, such as CH$_4$ or CCl$_2$F$_2$. The ion beam generated by IBE may include, but is not limited to, at least one of a ribbon beam, a spot beam, and a full substrate-size beam. At optional operation 607, the remaining resist material and the hardmask 314 are removed, as illustrated in FIGS. 3S-3V.

In summation, methods for forming a device structure having variable-depth device structures are described herein. The methods include forming device structures with variable depths in a device material layer using etch processing. The cyclic etch sub-method provides individual tunability of the etch rates of the gray-tone resist and of the device material layer for control of the device material layer pattern to be formed such that the device structures have variable depths. The etch rates of the gray-tone resist and the device material layer are tunable via selection of the resist materials and device structure materials, and the etch processes and chemistries of the resist etch process and the device material etch process.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    forming a gray-tone resist over a device material, the forming the gray-tone resist comprising:
        disposing a resist material over the device material; and
        developing the resist material to form a gray-tone pattern;
    performing a cyclic-etch process, the cyclic-etch process comprising:
        etching a resist segment of the gray-tone pattern using a resist etch process selective to the resist material;
        etching a device segment of the device material using a device pattern etch process selective to the device material; and
        repeating the resist etch process for subsequent resist segments of the gray-tone pattern and etching subsequent device segments to form a device material pattern, the top surface of the device material pattern having a gradient;
    disposing a hardmask over the device material;
    patterning the hardmask to expose segments of the device material; and
    etching exposed segments of the device material to form a plurality of device structures having a variable depth corresponding to the gradient.

2. The method of claim 1, wherein the etching the exposed segments of the device material forms the plurality of device structures with slant angles relative to a lower surface of the device material that are less than or greater than 90 degrees.

3. The method of claim 2, wherein the etching the exposed segments of the device material includes an angled etch process.

4. The method of claim 1, wherein the etching the exposed segments of the device material forms the plurality of device structures substantially perpendicular to a lower surface of the device material.

5. The method of claim 4, wherein the etching the exposed segments of the device material includes an isotropic etch process.

6. The method of claim 1, wherein an etch stop layer is disposed at a lower surface of the device material.

7. The method of claim 1, wherein forming the gray-tone pattern comprises laser ablation or a lithography process.

8. The method of claim 1, wherein an etch selectivity of the resist material to the device material is about 10:1 to about 1000:1.

9. The method of claim 1, wherein an etch selectivity of the device material to the resist material is about 1:1 to about 10:1.

10. The method of claim 1, wherein the device material is a substrate.

11. The method of claim 1, wherein the device material is a device material layer formed over a substrate.

12. The method of claim 1, further comprising removing residual resist material and disposing the hardmask over the device material subsequent to removing the residual resist material.

13. A method, comprising:
    disposing a device material layer over a surface of a substrate, the surface of the substrate having an etch stop layer;
    disposing a hardmask over the device material layer and patterning the hardmask to expose segments of the device material layer;
    forming a gray-tone resist over the hardmask, the forming the gray-tone resist comprising:
        disposing a resist material over the hardmask; and
        developing the resist material to form a gray-tone pattern; and
    performing a cyclic-etch process, the cyclic-etch process comprising:
        etching a resist segment of the gray-tone pattern using a resist etch process selective to the resist material;
        etching an exposed segment of the device material layer using a device etch process selective to a device material of the device material layer; and
        repeating the resist etch process for subsequent resist segments of the gray-tone pattern and repeating the device etch process for subsequent exposed device segments of the device material layer to form a plurality of device structures having a variable depth.

14. The method of claim 13, wherein the device etch process includes an angled etch process, and wherein the device etch process forms the plurality of device structures with slant angles relative to the surface of the substrate that are less than or greater than 90 degrees.

15. The method of claim 13, wherein forming the gray-tone pattern comprises laser ablation or a lithography process.

16. The method of claim 13, wherein the device etch process includes an isotropic etch process, and wherein the device etch process forms the plurality of device structures substantially perpendicular to the surface of the substrate.

17. The method of claim 13, wherein a depth of the plurality of device structures is less than a thickness of the device material.

18. The method of claim 13, wherein an etch selectivity of the resist material to a device material of the device material layer is about 10:1 to about 1000:1.

19. The method of claim 13, wherein an etch selectivity of the device material to the resist material is about 1:1 to about 10:1.

20. The method of claim 13, wherein the device material layer includes one or more silicon oxycarbide (SiOC), titanium dioxide (TiO$_2$), silicon dioxide (SiO$_2$), vanadium (IV) oxide (VOx), aluminum oxide (Al$_2$O$_3$), indium tin oxide (ITO), zinc oxide (ZnO), tantalum pentoxide (Ta$_2$O$_5$), silicon nitride (Si$_3$N$_4$), zirconium dioxide (ZrO$_2$), or silicon carbon-nitride (SiCN) containing materials.

21. A method, comprising:
- disposing a hardmask over a surface of a substrate and patterning the hardmask to expose segments of the substrate;
- forming a gray-tone resist over the hardmask, the forming the gray-tone resist comprising:
  - disposing a resist material over the hardmask; and
  - developing the resist material to form a gray-tone pattern using laser ablation; and
- performing a cyclic-etch process, the cyclic-etch process comprising:
  - etching a resist segment of the gray-tone pattern using a resist etch process selective to the resist material;
  - etching an exposed segment of the substrate using a device etch process selective to the substrate material; and
  - repeating the resist etch process for subsequent resist segments of the gray-tone pattern and repeating the device etch process to exposed segments of the substrate material layer to form a plurality of device structures in the substrate having a variable depth.

22. The method of claim 21, wherein the substrate includes one or more silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), zirconium dioxide ($ZrO_2$), or silicon carbon-nitride (SiCN) containing materials.

23. The method of claim 21, wherein the device etch process includes an angled etch process, and wherein the device etch process forms the plurality of device structures with slant angles relative to the surface of the substrate that are less than or greater than 90 degrees.

24. The method of claim 21, wherein forming the gray-tone pattern comprises laser ablation or a lithography process.

25. The method of claim 21, wherein the device etch process includes an isotropic etch process, and wherein the device etch process forms the plurality of device structures substantially perpendicular to the surface of the substrate.

26. The method of claim 21, wherein an etch selectivity of the resist material to a device material of the device material layer is about 10:1 to about 1000:1.

27. The method of claim 21, wherein an etch selectivity of the device material to the resist material is about 1:1 to about 10:1.

* * * * *